United States Patent
Yoo

(10) Patent No.: US 8,912,053 B2
(45) Date of Patent: Dec. 16, 2014

(54) NON-VOLATILE MEMORY DEVICE AND METHOD FOR FABRICATING THE SAME

(75) Inventor: Hyun-Seung Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 281 days.

(21) Appl. No.: 13/607,050

(22) Filed: Sep. 7, 2012

(65) Prior Publication Data
US 2013/0234234 A1 Sep. 12, 2013

(30) Foreign Application Priority Data
Mar. 8, 2012 (KR) .................. 10-2012-0024075

(51) Int. Cl.
*H01L 21/332* (2006.01)
*H01L 21/00* (2006.01)
*H01L 21/84* (2006.01)
*H01L 21/337* (2006.01)
*H01L 21/336* (2006.01)

(52) U.S. Cl.
USPC ........... 438/137; 438/156; 438/192; 438/269; 438/270; 257/E21.41; 257/E29.262

(58) Field of Classification Search
None
See application file for complete search history.

(56) References Cited

U.S. PATENT DOCUMENTS

2009/0121271 A1* 5/2009 Son et al. ............ 257/315
2011/0059595 A1* 3/2011 Jung ..................... 438/430
2011/0147824 A1* 6/2011 Son et al. ............ 257/324

FOREIGN PATENT DOCUMENTS

KR 1020090047614 5/2009

* cited by examiner

*Primary Examiner* — Calvin Choi
(74) *Attorney, Agent, or Firm* — IP & T Group LLP

(57) ABSTRACT

A method for fabricating a non-volatile memory device includes forming a stacked structure where a plurality of inter-layer dielectric layers and a plurality of second sacrificial layers are alternately stacked over a substrate, forming a channel layer that is coupled with a portion of the substrate by penetrating through the stacked structure, forming a slit that penetrates through the second sacrificial layers by selectively etching the stacked structure, removing the second sacrificial layers that are exposed through the slit, forming an epitaxial layer over the channel layer exposed as a result of the removal of the second sacrificial layers, and forming a gate electrode layer filling a space from which the second sacrificial layers are removed, and a memory layer interposed between the gate electrode layer and the epitaxial layer.

16 Claims, 7 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2012-0024075, filed on Mar. 8, 2012, which is incorporated herein by reference in its entirety.

BACKGROUND

1. Field

Exemplary embodiments of the present invention relate to a non-volatile memory device and a fabrication method thereof, and more particularly, to a non-volatile memory device including a plurality of memory cells that are stacked perpendicularly to a substrate, and a method for fabricating the non-volatile memory device.

2. Description of the Related Art

Non-volatile memory devices retain data stored therein although power is turned off. Diverse non-volatile memory devices, such as NAND-type flash memory devices, are widely used.

As improvement in the integration degree of two-dimensional non-volatile memory devices where memory cells are formed in a single layer over a silicon substrate has come across technical limitation, a three-dimensional non-volatile memory device where a plurality of memory cells are stacked perpendicularly to a silicon substrate is introduced.

The non-volatile memory device includes a plurality of channels that are stretched in a perpendicular direction to the substrate, a plurality of gate electrode layers that are stacked along the channels and insulated from each other by inter-layer dielectric layers, and a memory layer that is interposed between the gate electrode layers and the channels to insulate the gate electrode layers and the channels from each other and stores charges. The memory layer may have a triple-layer structure which includes a charge blocking layer that is disposed on the side of the gate electrode layers, a tunnel insulation layer that is disposed on the side of the channels, and a charge storage layer that is interposed between the charge blocking layer and the tunnel insulation layer.

In order to form the channels expanded in the perpendicular direction and form the memory layer along the channels in the fabrication process of the three-dimensional non-volatile memory device, a Chemical Vapor Deposition (CVD) process or an Atomic Layer Deposition (ALD) process that has excellent step coverage is used. The CVD process or the ALD process, however, may cause defects on the interface between the channels and the tunnel insulation layer, thus deteriorating the electrical characteristics of the non-volatile memory device.

Also, since the channels have a shape of pillars that are stretched in the perpendicular direction and the gate electrode layers and the inter-layer dielectric layers surround the channels, it is impossible to perform an ion implantation process onto the channels to form source/drain regions, just as the conventional two-dimensional non-volatile memory devices are fabricated, and thus, there are some concerns such as the deteriorated interference between neighboring cells and the decreased cell current.

SUMMARY

An embodiment of the present invention is directed to a non-volatile memory device having a three-dimensional structure and improved electrical characteristics, and a method for fabricating the non-volatile memory device.

A method for fabricating a non-volatile memory device includes forming a stacked structure where a plurality of inter-layer dielectric layers and a plurality of second sacrificial layers are alternately stacked over a substrate; forming a channel layer that is coupled with a portion of the substrate by penetrating through the stacked structure; removing the second sacrificial layers; forming an epitaxial layer over the channel layer exposed by the removal of the second sacrificial layers; and forming a gate electrode layer filling a space from which the second sacrificial layers are removed, and a memory layer interposed between the gate electrode layer and the epitaxial layer.

In accordance with another embodiment of the present invention, a non-volatile memory device includes a stacked structure formed over a substrate and including a plurality of inter-layer dielectric layers and a plurality of gate electrodes that are alternately stacked; a channel layer coupled with a portion of the substrate by penetrating through the stacked structure; an epitaxial layer interposed between the channel layer and the gate electrode; and a memory layer interposed between the epitaxial layer and the gate electrode.

DETAILED DESCRIPTION

Figure 1:
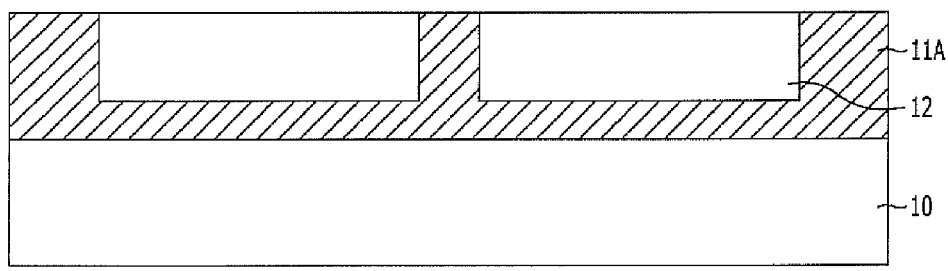
FIGS. 1 to 9 are cross-sectional views illustrating a non-volatile memory device and a fabrication method thereof in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 9:
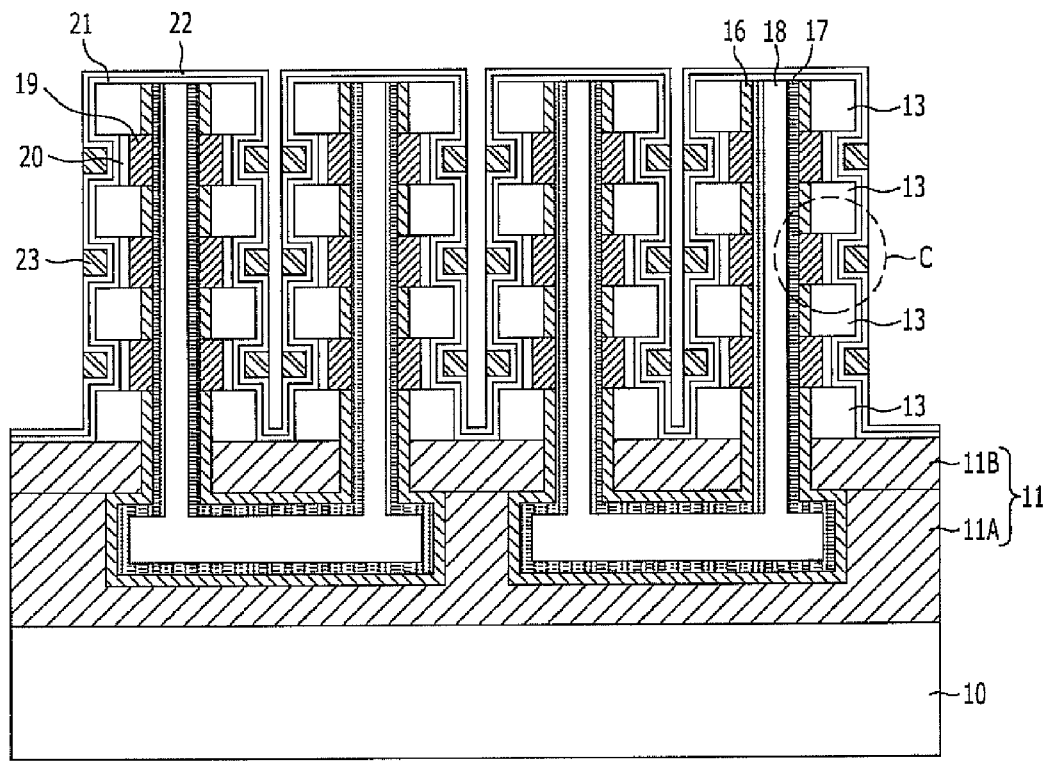
Figure 10:
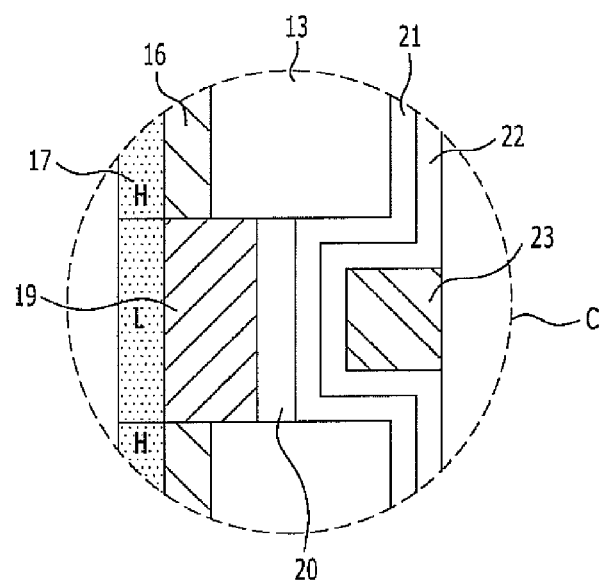
FIG. 10 is an enlarged view of a C part shown in FIG. 9.

Hereafter, a non-volatile memory device and a fabrication method thereof in accordance with an embodiment of the present invention are described with reference to FIGS. 1 to 10. FIGS. 1 to 9 are cross-sectional views illustrating a non-volatile memory device and a fabrication method thereof in accordance with an embodiment of the present invention. Particularly, FIG. 9 shows the non-volatile memory device, and FIGS. 1 to 8 illustrate procedural steps for fabricating the non-volatile memory device of FIG. 9. FIG. 10 is an enlarged view of a C part of FIG. 9.

Referring to FIG. 1, a substrate 10 is provided. The substrate 10 may be formed of a semiconductor material such as monocrystalline silicon, and an insulation layer, which is not illustrated in the drawing, may be formed in the uppermost portion of the substrate 10 to insulate the substrate 10 from a gate electrode of a pipe channel transistor, which is to be described later. The gate electrode of a pipe channel transistor is referred to as a pipe gate electrode, hereafter.

Subsequently, a first conductive layer 11A for forming a pipe gate electrode is formed over the substrate 10, and then a first sacrificial layer 12 is formed by selectively etching the first conductive layer 11A and filling it with an insulation material. The first conductive layer 11A may be a polysilicon layer doped with an impurity. The first sacrificial layer 12 defines a space where a channel of a pipe channel transistor is to be formed. The first sacrificial layer 12 has a shape of island having a long axis of the cross-sectional direction shown in the drawing, which is referred to as a first direction hereafter, and a short axis of a cross direction to the first direction, which penetrates through the drawing (not shown in drawing). A plurality of first sacrificial layers 12 are arrayed in the first and second directions. Although the drawing illustrates a case where two first sacrificial layers 12 are arrayed in the first direction for the sake of convenience in description, the scope and concept of the present invention is not limited to it and multiple first sacrificial layers 12 may be arrayed in the first direction and the second direction. The first sacrificial layer 12 may be a nitride layer.

Figure 2:
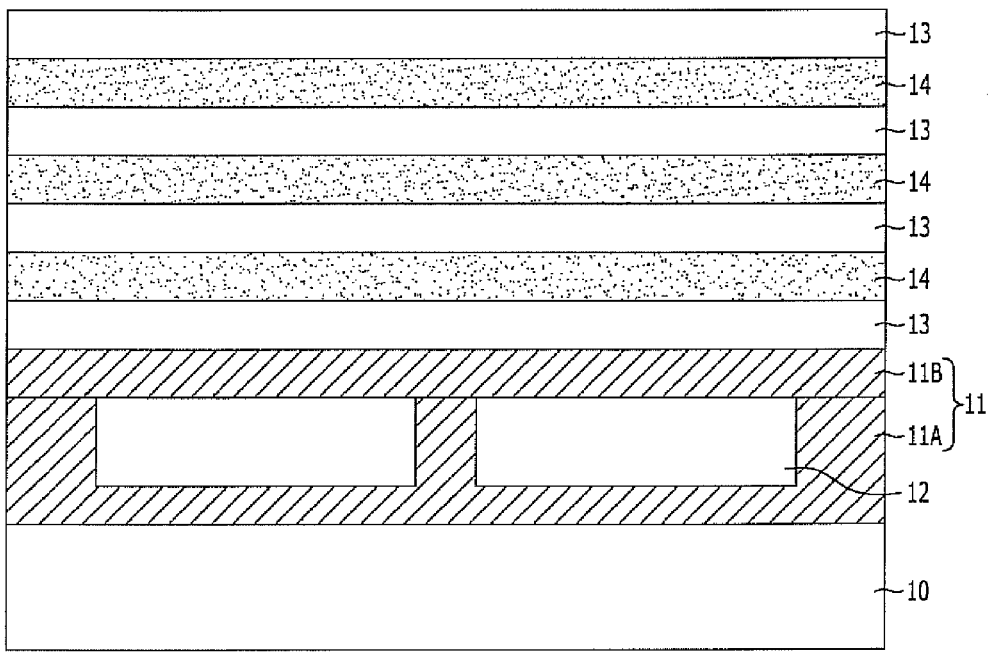

Referring to FIG. 2, a second conductive layer 11B for forming a pipe gate electrode is formed over the first conductive layer 11A and the first sacrificial layer 12. The second conductive layer 11B may be a polysilicon layer doped with an impurity. The first conductive layer 11A and the second conductive layer 11B are collectively referred to as a pipe gate electrode layer 11, hereafter.

Subsequently, a plurality of inter-layer dielectric layers 13 and a plurality of second sacrificial layers 14 are alternately stacked in a perpendicular direction over the second conductive layer 11B. The second sacrificial layers 14 provide a space where the gate electrodes of memory cells are to be formed, and the second sacrificial layers 14 may be formed of a material having an etch selectivity from the inter-layer dielectric layers 13, such as a nitride. The inter-layer dielectric layers 13 insulate the gate electrodes of memory cells from each other, and the inter-layer dielectric layers 13 may be oxide layers.

Figure 3:
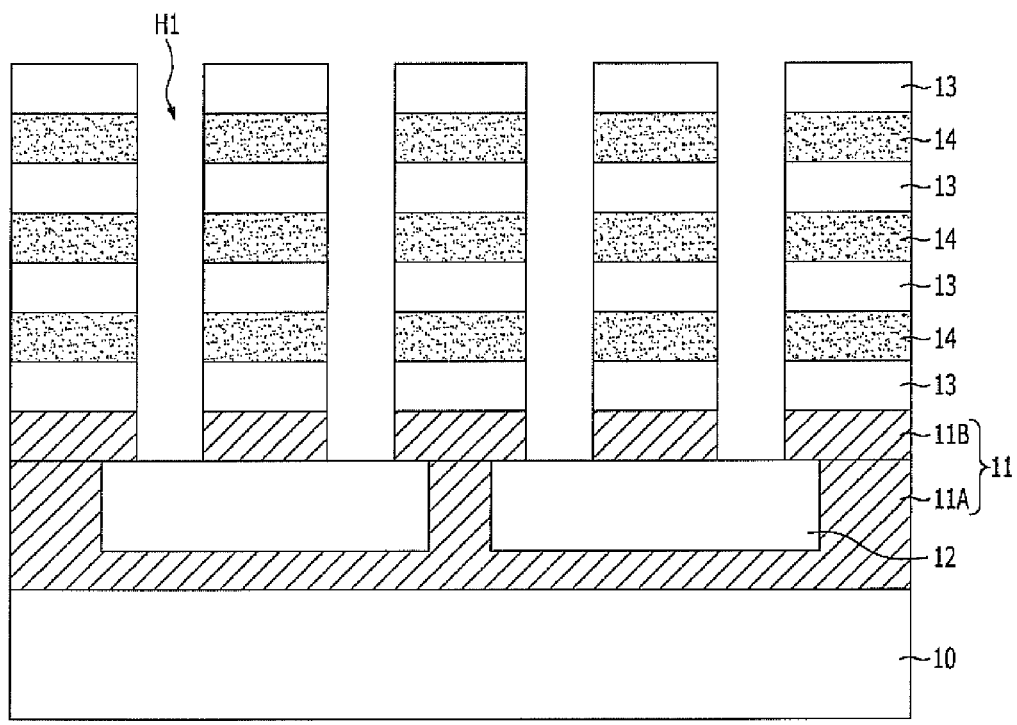

Referring to FIG. 3, a pair of first channel holes H1 that exposes the first sacrificial layer 12 is formed by selectively etching the second conductive layer 11B and the stacked structure where the inter-layer dielectric layers 13 and the second sacrificial layers 14 are alternately stacked. A pair of first channel holes H1 is disposed in the first direction for each first sacrificial layer 12.

Figure 4:
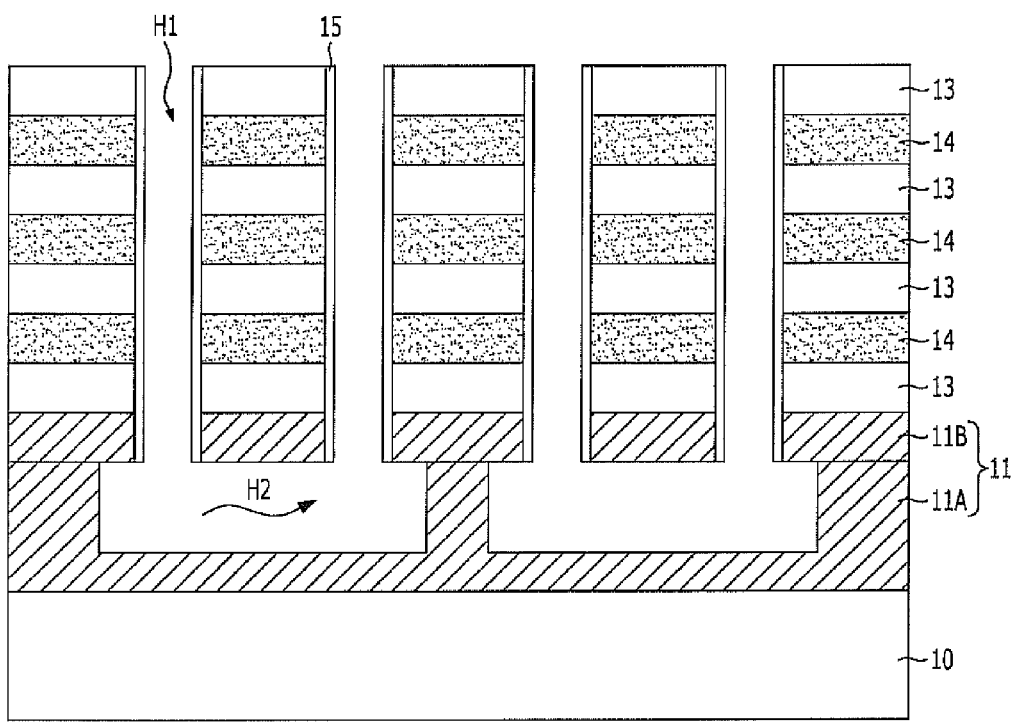

Referring to FIG. 4, a protective layer 15 is formed on the sidewalls of the first channel holes H1, and then second channel holes H2 are formed by removing the exposed first sacrificial layer 12.

The protective layer 15 is formed on the sidewalls of the first channel holes H1 by depositing a material layer for forming the protective layer 15 over the substrate structure including the first channel holes H1 and then performing a dry etch process to remove a material layer on the bottom of the first channel holes H1 and in the upper portion of the stacked structure where the inter-layer dielectric layers 13 and the second sacrificial layers 14 are alternately stacked.

The protective layer 15 protects the second sacrificial layers 14 from being damaged in the process of removing the first sacrificial layer 12 when both of the first sacrificial layer 12 and the second sacrificial layers 14 are all nitride layers. The protective layer 15 may be formed of a material having an etch selectivity from the first sacrificial layer 12, for example, the protective layer 15 may be an oxide layer or an amorphous carbon layer. When the first sacrificial layer 12 and the second sacrificial layers 14 are formed of materials having different etch selectivities, the process of forming the protective layer 15 may be omitted. For example, when any one between the first sacrificial layer 12 and the second sacrificial layers 14 is a nitride layer, and the other one is formed of an amorphous carbon layer, it might be not required to perform the process of forming the protective layer 15.

The first sacrificial layer 12 may be removed through a wet etch process. When the first sacrificial layer 12 is a nitride layer, it may be removed through a wet etch process using phosphoric acid.

As a result, the lower ends of the pair of the first channel holes H1 are coupled with each other through a second channel hole H2 so as to form a U-shaped channel hole H1 and H2.

Figure 5:
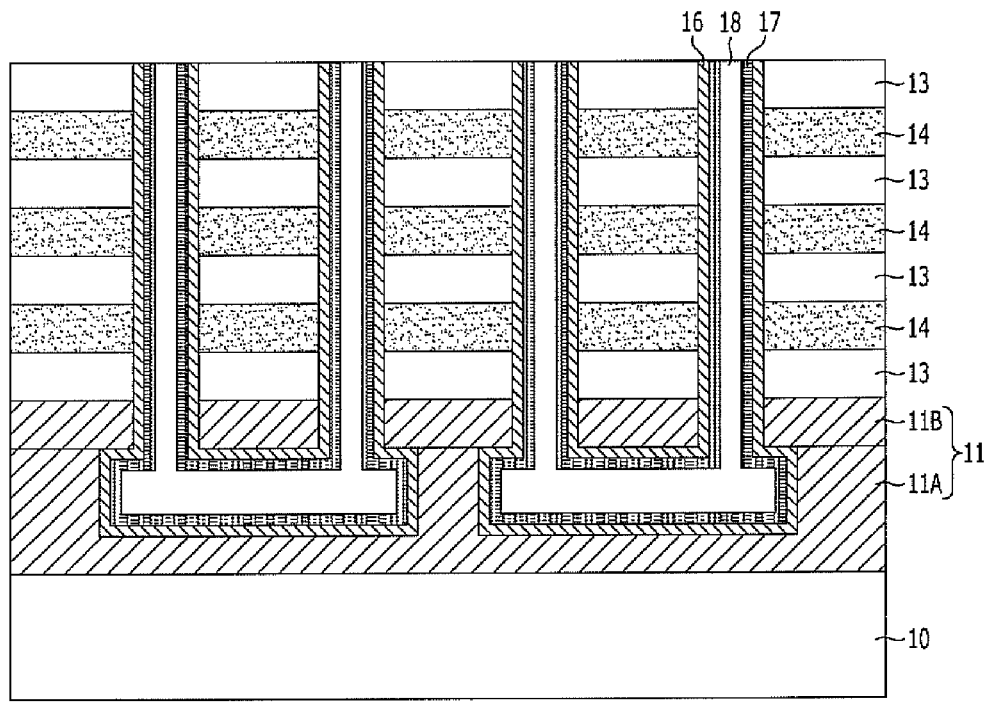

Referring to FIG. 5, the protective layer 15 is removed through a method such as a wet etch process, and then a gate insulation layer of the pipe channel transistor, which is referred to as a pipe gate insulation layer 16, is formed along the internal walls of the U-shaped channel hole H1 and H2. Subsequently, a channel layer 17 is formed over the pipe gate insulation layer 16, and the remaining space of the U-shaped channel hole H1 and H2 is filled with an insulation layer 18.

The pipe gate insulation layer 16 insulates the pipe gate electrode layer 11 and the channel layer 17 from each other. The pipe gate insulation layer 16 may be an oxide layer. As a result of this process, a pipe channel transistor including the pipe gate electrode layer 11, the channel layer 17, and the pipe gate insulation layer 16 interposed between the pipe gate electrode layer 11 and the channel layer 17 is formed.

The channel layer 17 is used to form the channels of the pipe channel transistor and the channels of the memory cells. In particular, the channel layer 17 may be formed of a polycrystalline semiconductor material doped with a high-concentration impurity. Also, the channel layer 17 may be formed through an Atomic Layer Deposition (ALD) process or a Chemical Vapor Deposition (CVD) process which has excellent step coverage characteristics.

The insulation layer 18 may be an oxide layer or a nitride layer. In accordance with an embodiment of the present invention, the insulation layer 18 is formed because the channel layer 17 is not thick enough to fill all of the U-shaped channel hole H1 and H2. Therefore, when the channel layer 17 fills the U-shaped channel hole H1 and H2 according to another embodiment of the present invention, the insulation layer 18 may be not required.

Figure 6:
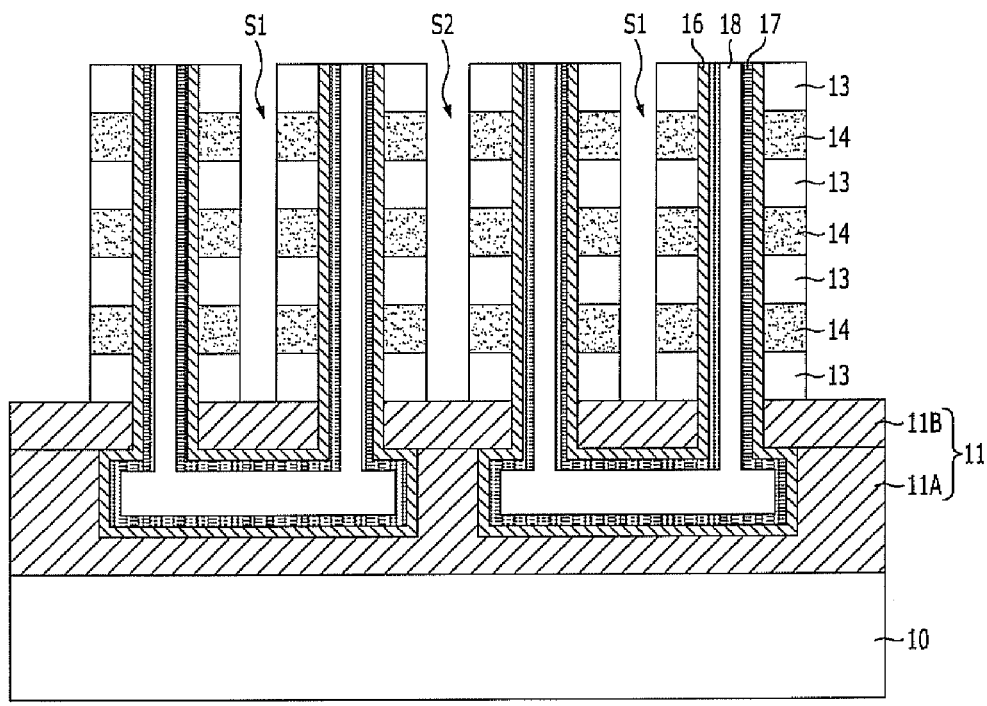

Referring to FIG. 6, a first slit S1 and a second slit S2 are formed. The first slit S1 is disposed between a pair of first channel holes H1 that are coupled with each other through one second channel hole H2 and penetrates through the stacked structure of the inter-layer dielectric layers 13 and the second sacrificial layers 14. The second slit S2 is disposed between neighboring first channel holes H1 while not sharing a second channel hole H2 and penetrates through the stacked structure of the inter-layer dielectric layers 13 and the second sacrificial layers 14.

The first slit S1 separates the gate electrodes of the memory cells in one string in one side and another side of the pair of first channel holes H1. The first slit S1 may be stretched in the second direction. Furthermore, the first slit S1 provides a space into which a wet etch solution may permeate to remove the second sacrificial layers 14. The first slit S1 has a thickness penetrate through the stacked structure according to the embodiment of the present invention, but the scope of the present invention is not limited to it and the first slit S1 has a thickness that penetrates the lowermost second sacrificial layers 14.

The second slit S2 separates plural strings from each other. The second slit S2 has a similar shape to that of the first slit S1 in the embodiment of the present invention, but the scope of the present invention is not limited to it.

Figure 7:
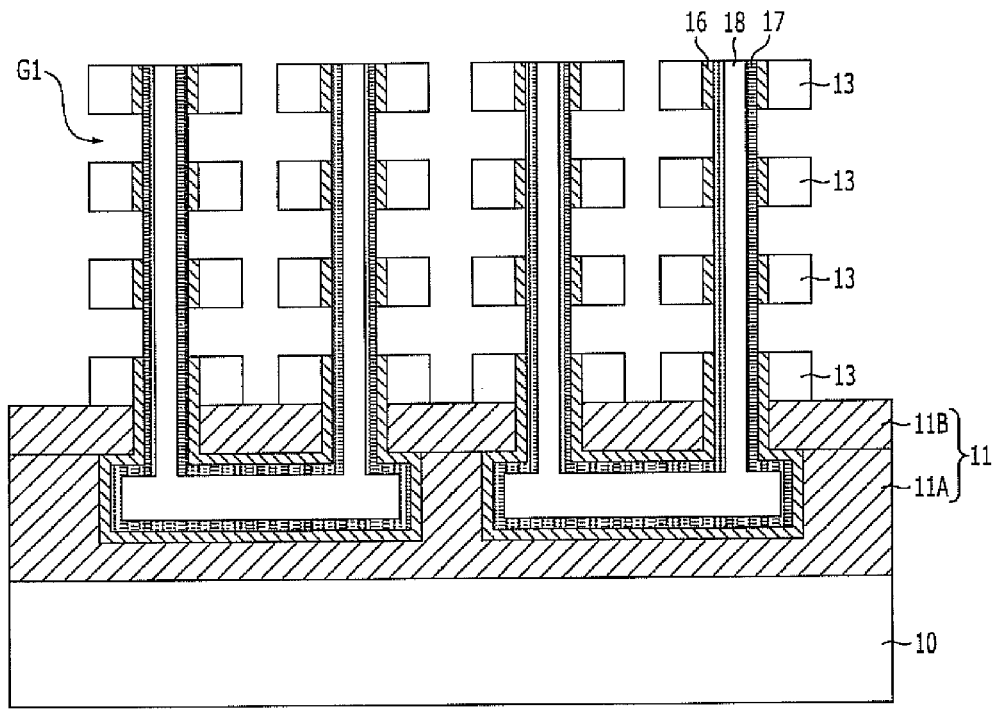

Referring to FIG. 7, after the second sacrificial layers 14 exposed through the first slit S1 and the second slit S2 is removed, a groove G1 is formed to expose the channel layer 17 by removing a portion of the exposed pipe gate insulation layer 16. The second sacrificial layers 14 and the pipe gate insulation layer 16 may be removed through a wet etch process.

Figure 8:
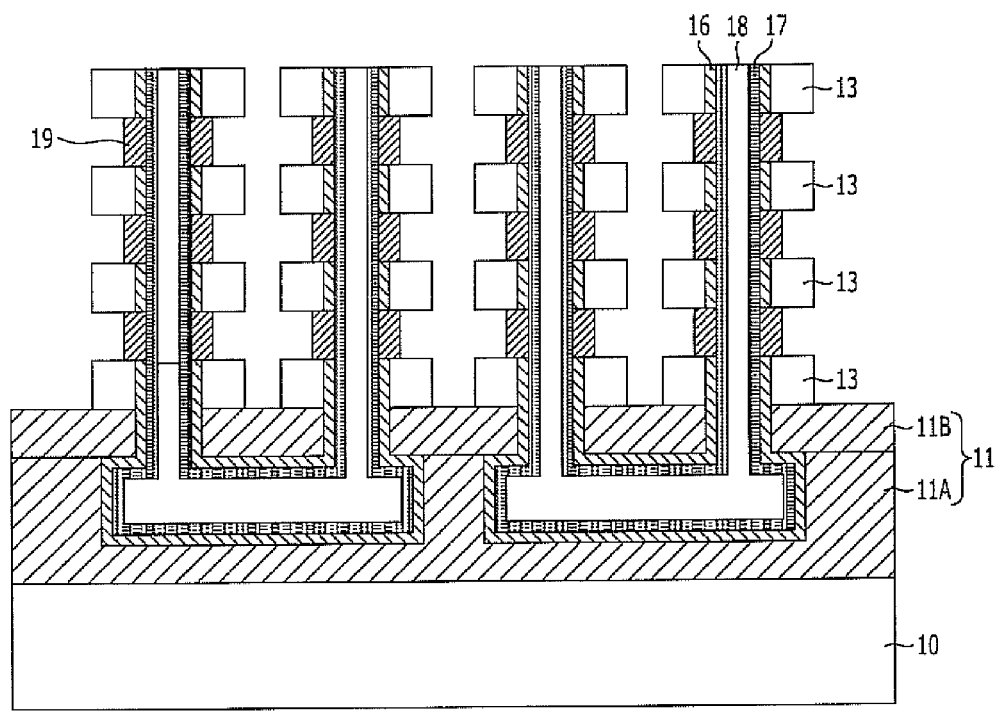

Referring to FIG. 8, an epitaxial layer 19 filling a portion of the groove G1 is formed over the exposed channel layer 17 by performing a selective epitaxial growth process. The epitaxial layer 19 forms a channel along with the channel layer 17.

When the epitaxial layer 19 is formed, a tunnel insulation layer, which is to be formed later, comes to contact the epitaxial layer 19 instead of the channel layer 17, which is formed through the ALD process or the CVD process. As a result, the defect on the interface between the channel and the tunnel insulation layer may be decreased.

Meanwhile, as described above, the channel layer 17 may be formed of a polycrystalline semiconductor material doped with a high-concentration impurity. In this case, as the selective epitaxial growth process is performed, the impurity of the channel layer 17 may move to the epitaxial layer 19. As a result, the portion of the channel layer 17 that substantially corresponds to the epitaxial layer 19 becomes a low-concentration polycrystalline semiconductor (refer to 'L' of FIG. 10), and the other portion of the channel layer 17 maintains to be a high-concentration polycrystalline semiconductor (refer to 'H' of FIG. 10). Consequently, as the epitaxial layer 19 is formed, the portion of the channel layer 17 that corresponds to the gate electrodes of the memory cells, which are to be described later, becomes a low-concentration polycrystalline semiconductor and used as a typical channel region, and the other region of the channel layer 17, which is a part between the gate electrodes of the memory cells, remains as a high-concentration polycrystalline semiconductor and used as a source/drain region. In short, a source/drain region may be formed without performing an ion implantation process in accordance with the embodiment of the present invention.

Referring to FIG. 9, a tunnel insulation layer 20 having a thickness filling a portion of the groove G1 is formed over the epitaxial layer 19. The tunnel insulation layer 20 is a layer for the tunneling of charges, and the tunnel insulation layer 20 may be an oxide layer.

In particular, the tunnel insulation layer 20 may be formed through a thermal oxidation process. When the tunnel insulation layer 20 is formed through a thermal oxidation process, the defect on the interface between the epitaxial layer 19 and the tunnel insulation layer 20 may be reduced. Furthermore, more impurity of the channel layer 17 moves to the epitaxial layer 19 due to the high-temperature process, it is favorable for forming the low-concentration polycrystalline semiconductor (refer to 'L' of FIG. 10) and the high-concentration polycrystalline semiconductor (refer to 'H' of FIG. 10).

Subsequently, a charge storage layer 21 and a charge blocking layer 22 are sequentially formed in a thickness that fills a portion of the groove G1 over the profile of the substrate structure. The charge storage layer 21 is a layer for storing charges, and the charge storage layer 21 may be an insulation layer such as a nitride layer having a charge trapping function. The charge blocking layer 22 prevents charges from transferring between the charge storage layer 21 and a third conductive layer, which is to be formed later. The charge blocking layer 22 may be an oxide layer. The charge storage layer 21 and the charge blocking layer 22 may be formed through an ALD process or a CVD process.

Subsequently, a third conductive layer 23 filling the space inside the groove G1 is formed to form the gate electrodes of the memory cells. The third conductive layer 23 may be formed by forming a conductive material covering the substrate structure including the charge blocking layer 22 and then performing a blanket etch process until the charge blocking layer 22 is exposed. The third conductive layer 23 may be formed of polysilicon doped with an impurity or metal.

As a result of the process, memory cells include the third conductive layer 23, the channel layer 17 and the epitaxial layer 19, and the memory layer which includes the tunnel insulation layer 20, the charge storage layer 21 and the charge blocking layer 22, interposed between the channels are formed.

Since subsequent processes, which include a process of forming bit lines coupled with the upper end of one side of the channel layer 17, and another process for forming source lines coupled with upper end of the other side of the channel layer 17, are widely known to those skilled in the art, further description on the subsequent processes is omitted herein.

The non-volatile memory device of FIGS. 9 and 10 is fabricated through the fabrication process described above.

Referring back to FIGS. 9 and 10, the non-volatile memory device in accordance with the embodiment of the present invention includes a plurality of memory cells and a pipe channel transistor. The memory cells include the inter-layer dielectric layers 13 and the third conductive layers 23 that are alternately stacked along the channel layers 17 stretched perpendicularly to the substrate 10, and the memory layer interposed between the channel layer 17 and the third conductive layer 23. The memory layer includes the tunnel insulation layer 20, the charge storage layer 21, and the charge blocking layer 22. The pipe channel transistor is disposed under the multiple memory cells and includes the pipe gate electrode layer 11, the pipe gate insulation layer 16, and the channel layer 17 interposed between the pipe gate electrode layer 11 and the pipe gate insulation layer 16. The pipe channel transistor may selectively couple a first sub-string with a second sub-string. The first sub-string is formed of memory cells formed along the channel layer 17 that is formed in one of a pair of first channel holes H1. The second sub-string is formed of memory cells formed along the channel layer 17 that is formed in the other of the pair of first channel holes H1. The sub-strings of the pair are coupled with each other so as to form one U-shaped string.

The epitaxial layer 19 is further formed on the sidewall of the channel layer 17 facing the third conductive layer 23. The memory layer is interposed between the epitaxial layer 19 and the third conductive layer 23. Therefore, the interface characteristics between the epitaxial layer 19 and the tunnel insulation layer 20 may be improved. Furthermore, since the concentration of the impurity in the portion of the channel layer 17 corresponding to the epitaxial layer 19 is lower than the concentration of the impurity in the other portion of the channel layer 17, the portion of the channel layer 17 having relatively low impurity concentration and the other portion of the channel layer 17 having relatively high impurity concentration may serve as channel regions and source/drain regions, respectively. The tunnel insulation layer 20 may be a thermal oxide layer, and thus the interface characteristics and source/drain region function may be improved.

Meanwhile, when the channel layer 17 is formed of a high-concentration polycrystalline semiconductor material in the above-described embodiment of the present invention, it might be not required to form the pipe gate electrode layer 11 because the pipe channel transistor maintains to be in an ON state regardless of the voltage applied to the pipe gate electrode layer 11. In this case, the pipe gate electrode layer 11 may be substituted with an insulation layer, such as a nitride layer or an oxide layer, or the pipe gate electrode layer 11 may be formed of the same semiconductor material as the substrate.

Although the embodiment of the present invention describes the three-dimensional non-volatile memory device having a U-shaped string structure with reference to FIGS. 1 to 10, the scope and concept of the present invention are not limited to it. The technology of the present invention may be applied to all three-dimensional non-volatile memory devices where a memory layer and a gate electrode material are formed in the space from which a sacrificial layer is removed. This is described below with reference to FIGS. 11 to 13. Description on a portion that is substantially the same as that of the embodiment is omitted herein.

Figure 11:
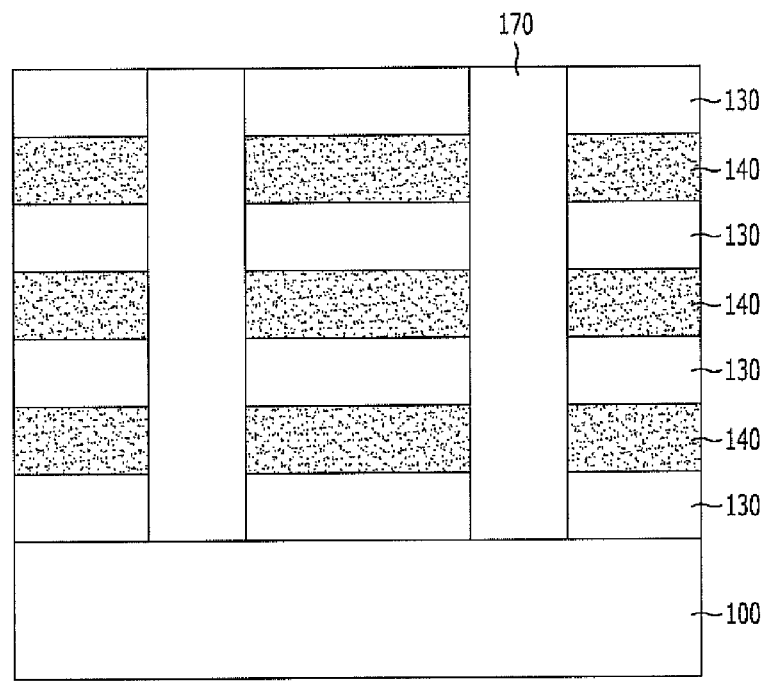
FIGS. 11 to 13 are cross-sectional views illustrating a non-volatile memory device and a fabrication method thereof in accordance with another embodiment of the present invention.
Figure 12:
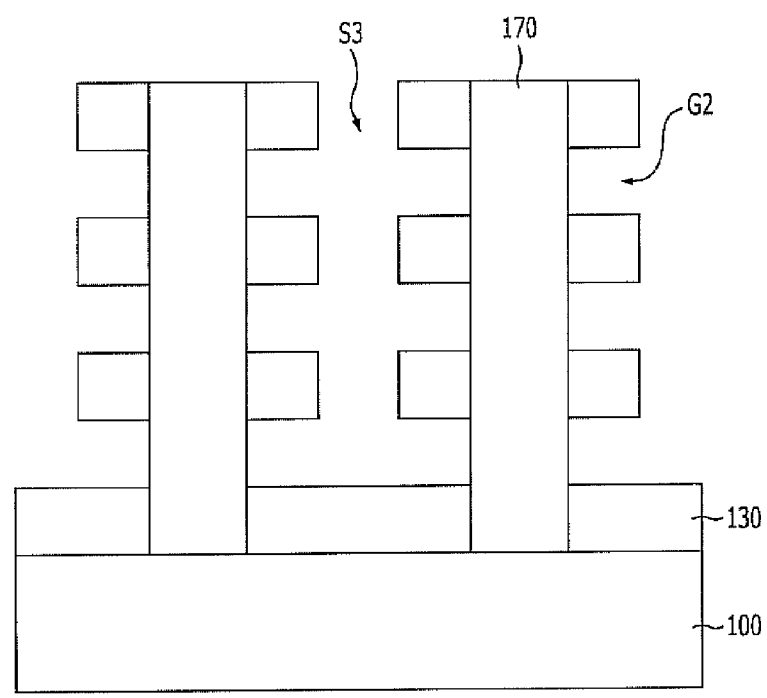
Figure 13:
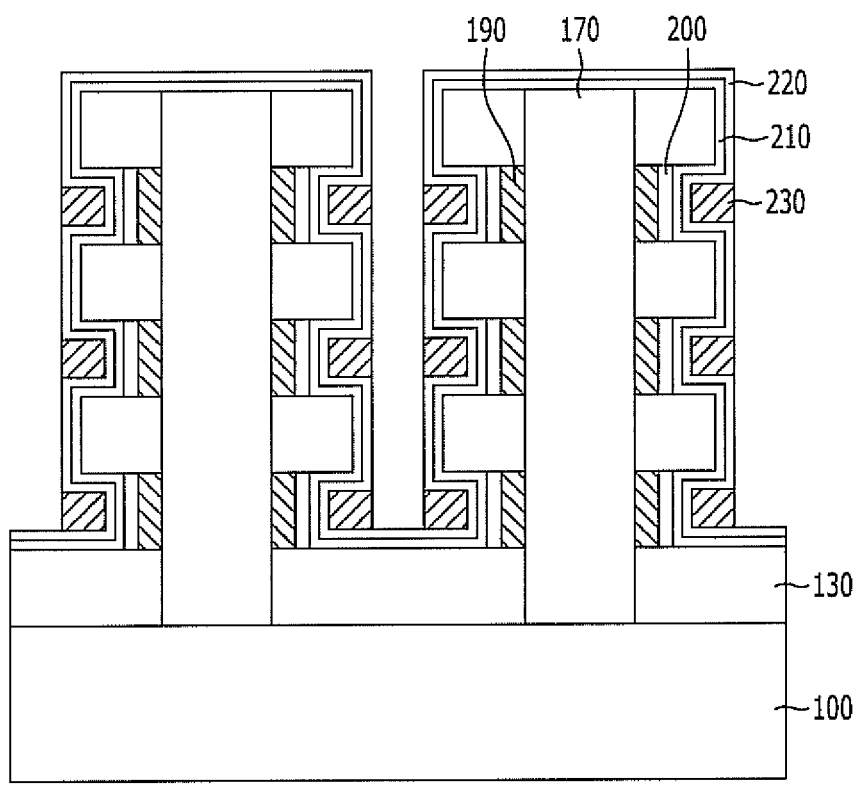

FIGS. 11 to 13 are cross-sectional views illustrating a non-volatile memory device and a fabrication method thereof in accordance with another embodiment of the present invention.

Referring to FIG. 11, a substrate 100 having a predetermined understructure is provided. The substrate 100 may be formed of a semiconductor material such as monocrystalline silicon, and a source region (not shown) doped with an impurity, for example, an N-type impurity, may be formed in a portion of the substrate 100.

Subsequently, a plurality of inter-layer dielectric layers 130 and a plurality of sacrificial layers 140 are alternately stacked over the substrate 100 in the perpendicular direction.

Subsequently, channel holes that expose a portion of the substrate 100 are formed by selectively etching the stacked structure where the inter-layer dielectric layers 130 and the sacrificial layers 140 are alternately stacked, and a channel layer 170 is formed by filling the channel holes with a semiconductor material. Particularly, the channel layer 170 may be formed of a polycrystalline semiconductor material doped with a high-concentration impurity, which is the same as the above-described embodiment.

Referring to FIG. 12, slits S3 are formed by selectively etching the stacked structure of the inter-layer dielectric layers 130 and the sacrificial layers 140. Since the slits S3 are used to remove the sacrificial layers 140, the slits S3 is required to have a thickness that penetrates the lowermost sacrificial layers 140 and the slits S3 might be not required to have a shape stretched in the second direction just as the above-described first slits S1 do.

Subsequently, grooves G2 are formed to expose the channel layer 170 by removing the sacrificial layers 140 that are exposed through the slits S3.

Referring to FIG. 13, an epitaxial layer 190 filling a portion of each groove G2 is formed over the exposed channel layer 170 by performing a selective epitaxial growth process.

Subsequently, a tunnel insulation layer 200, a charge storage layer 210, and a charge blocking layer 220 are sequentially formed to fill a portion of each groove G2, and a gate electrode-forming conductive layer 230 filling the other portion of the groove G2 is formed.

This embodiment of the present invention is substantially the same as the embodiment described earlier, except that linear strings where the source regions are disposed in the lower portion and the bit lines are disposed in the upper portion are formed.

The non-volatile memory device and the fabrication method thereof in accordance with an embodiment of the present invention have a three-dimensional structure and improved electrical characteristics.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a non-volatile memory device comprising:
    forming a stacked structure where a plurality of inter-layer dielectric layers and a plurality of second sacrificial layers are alternately stacked over a substrate;
    forming a channel layer that is coupled with a portion of the substrate by penetrating through the stacked structure;
    removing the second sacrificial layers;
    forming an epitaxial layer over the channel layer exposed by the removal of the second sacrificial layers; and
    forming a gate electrode layer filling a space from which the second sacrificial layers are removed, and a memory layer interposed between the gate electrode layer and the epitaxial layer.

2. The method of claim 1, wherein the removing the second sacrificial layers comprising:
    forming a slit that penetrates through the second sacrificial layers by selectively etching the stacked structure; and
    removing the second sacrificial layers that are exposed through the slit.

3. The method of claim 1, wherein the channel layer includes a polycrystalline semiconductor doped with an impurity.

4. The method of claim 3, wherein the forming of the memory layer comprises:
    sequentially forming a tunnel insulation layer, a charge storage layer, and a charge blocking layer, and
    the tunnel insulation layer is formed through a thermal oxidation process, and
    the impurity of a portion of the channel layer transfers into the epitaxial layer during the forming of the epitaxial layer and the forming of the tunnel insulation layer.

5. The method of claim 3, wherein the impurity of a portion of the channel layer transfers into the epitaxial layer during the forming of the epitaxial layer.

6. The method of claim 1, wherein the forming of the memory layer comprises:
    sequentially forming a tunnel insulation layer, a charge storage layer, and a charge blocking layer.

7. The method of claim 6, wherein the tunnel insulation layer is formed through a thermal oxidation process.

8. The method of claim 1, wherein the substrate includes a first sacrificial layer of an island type, and
    the forming of the channel layer includes:
        forming a pair of first holes that expose the first sacrificial layer by selectively etching the stacked structure;
        forming a second hole by removing the first sacrificial layer that is exposed through the first holes; and
        depositing the channel layer inside the first holes and the second hole.

9. The method of claim 8, wherein the substrate further includes a pipe gate electrode layer surrounding the first sacrificial layer, and
    further comprising:

forming a gate insulation layer inside the first holes and the second hole before the channel layer is deposited.

10. A non-volatile memory device, comprising:
a stacked structure formed over a substrate and including a plurality of inter-layer dielectric layers and a plurality of gate electrodes that are alternately stacked;
a channel layer coupled with a portion of the substrate by penetrating through the stacked structure;
an epitaxial layer interposed between the channel layer and the gate electrode; and
a memory layer interposed between the epitaxial layer and the gate electrode.

11. The non-volatile memory device of claim 10, wherein an impurity concentration of a first portion of the channel layer facing the epitaxial layer is lower than an impurity concentration of a second portion of the channel layer, where the second portion of the channel layer is a region of the channel layer other than the first portion of the channel layer.

12. The non-volatile memory device of claim 11, wherein the second portion of the channel layer is used as a source region or a drain region.

13. The non-volatile memory device of claim 10, wherein the memory layer includes a tunnel insulation layer, a charge storage layer, and a charge blocking layer that are sequentially disposed from a part close to the epitaxial layer.

14. The non-volatile memory device of claim 13, wherein the tunnel insulation layer is a thermal oxide layer.

15. The non-volatile memory device of claim 10, wherein the channel layer includes:
a pair of first channel layers that are stretched perpendicularly to the substrate; and
a second channel layer for coupling bottom ends of the first channel layers of the pair with each other.

16. The non-volatile memory device of claim 15, further comprising:
a pipe gate electrode layer surrounding the second channel layer; and
a gate insulation layer interposed between the pipe gate electrode layer and the second channel layer.

* * * * *